US00RE37739E

(19) United States
(12) Reissued Patent
Sutardja et al.

(10) Patent Number: US RE37,739 E
(45) Date of Reissued Patent: Jun. 11, 2002

(54) CONTROLLABLE INTEGRATOR

(75) Inventors: Sehat Sutardja, Cupertino; Pantas Sutardja, San Jose, both of CA (US)

(73) Assignee: Marvell International Ltd. (BM)

(21) Appl. No.: 09/609,007

(22) Filed: Jun. 22, 2000

Related U.S. Patent Documents

Reissue of:
(64) Patent No.: 5,805,006
Issued: Sep. 8, 1998
Appl. No.: 08/848,549
Filed: Apr. 28, 1997

(51) Int. Cl.[7] ..... G06G 7/64
(52) U.S. Cl. ..... 327/336; 327/91; 327/65
(58) Field of Search ..... 327/336, 339, 327/344, 91, 94, 96, 563, 589, 52, 54, 63, 65–67, 77, 89, 560–562, 403; 330/252, 253, 258, 311, 69, 124 R, 295

(56) References Cited

U.S. PATENT DOCUMENTS 4,370,572 A * 1/1983 Cosand et al. ..... 327/96
4,484,089 A 11/1984 Viswanathan ..... 307/297
4,499,387 A 2/1985 Konishi ..... 307/443
4,555,673 A * 11/1985 Huijsing et al. ..... 330/258
5,252,865 A * 10/1993 Davenport et al. ..... 327/336
5,283,631 A 2/1994 Koerner et al. ..... 307/451
5,371,474 A * 12/1994 Wassenaar et al. ..... 330/258
5,510,738 A 4/1996 Gorecki et al. ..... 327/103
5,517,141 A 5/1996 Abdi et al. ..... 327/96
5,600,275 A 2/1997 Garavan ..... 327/307
5,631,607 A * 5/1997 Huijsing et al. ..... 330/258
5,666,083 A 9/1997 Myers et al. ..... 327/553
5,682,119 A * 10/1997 Soda ..... 330/252
5,914,638 A 6/1999 He ..... 330/258
6,040,732 A 3/2000 Brokaw ..... 327/408

* cited by examiner

*Primary Examiner*—Toan Tran
(74) *Attorney, Agent, or Firm*—Katten Muchin Zavis; Eric B. Janopsky

(57) ABSTRACT

Integrated circuitry for selectively introducing capacitance and for controlling the transconductance transfer function of one or more amplifiers includes concatenated differential amplifiers with one or more pairs of switchable capacitive components differentially connected across outputs of the differential amplifiers to facilitate operation over a wide range of operating frequencies under control of external signals.

46 Claims, 2 Drawing Sheets

CONTROLLABLE INTEGRATOR

Matter enclosed in heavy brackets [ ] appears in the original patent but forms no part of this reissue specification; matter printed in italics indicates the additions made by reissue.

FIELD OF THE INVENTION

This invention relates to integrators and more particularly to circuitry in an integrated circuit that controls frequency response characteristics over a wide range of frequencies with adjustable capacitance and controllable transconductance.

BACKGROUND OF THE INVENTION

Circuit components formed in integrated circuits commonly exhibit wide variations in operating characteristics attributable to variations in the semiconductor processes that form the integrated circuit of such components. By traditional design practices, additional or redundant components may be formed in an integrated circuit during the processing phase, and such additional components may thereafter be connected in or out of a circuit using a laser beam to selectively sever connecting links as required to adjust the operating characteristics of the circuit. Alternatively, signal controllable switches may be incorporated into the design of the integrated circuit to selectively connect additional components in response to externally applied control signals. However, such switches are not ideal in that they incorporate appreciable resistance into a circuit in the conductive state which can be detrimental to high frequency operating characteristics of the integrated circuit.

SUMMARY OF THE INVENTION

In accordance with one embodiment of the present invention, additional capacitive components may be selectively switched into circuit configuration in response to external control signals without introducing significant resistance with the capacitive components. In addition, controllable gain elements may be selectively controlled to amplify the effectiveness of capacitive components in the circuit for a wide range of operating frequency characteristics of the circuit as selectively configured.

DETAILED DESCRIPTION OF THE INVENTION

Figure 1:
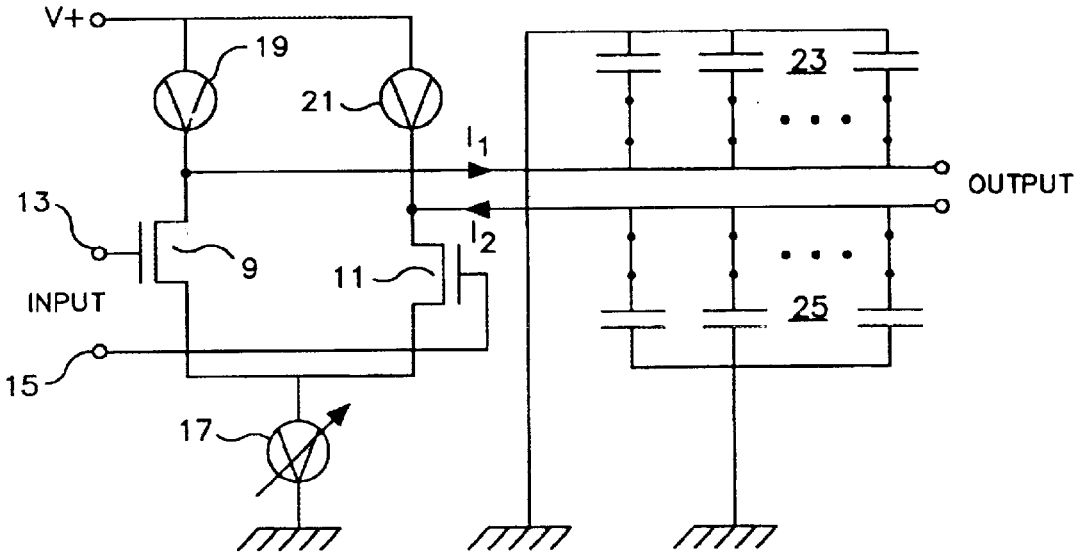
FIGURE 1 (PRIOR ART)
FIG. 1 is a circuit diagram of a conventional transconductance integrator.

Referring now to FIG. 1, there is shown a conventional integrator including a differential pair of gain stages 9, 11 such as field-effect transistors having control electrodes, or gates, coupled to receive control signals applied to inputs 13, 15. The source electrodes, or sources, of the gain stages are coupled together and to a controllable current source 17, and each of the drain electrodes, or drains, is coupled to a controllable current sources 19, 21 and to one or more capacitive elements 23, 25. The sum of the current sources 19, 21 is usually set equal to the current from source 17. Selected ones of the capacitive elements may be coupled to ground, for example, via links that may be removed via laser-beam machining to alter the operating frequency characteristics of the circuit. Alternatively, semiconductor switches may be substituted (not shown) for the links to facilitate control of capacitance in the circuit in response to externally applied signals. However, such semiconductor switches commonly introduce significant resistance along with capacitance thus switched into the circuit, and this adversely affects high frequency operating characteristics of the circuit thus configured.

Figure 2:
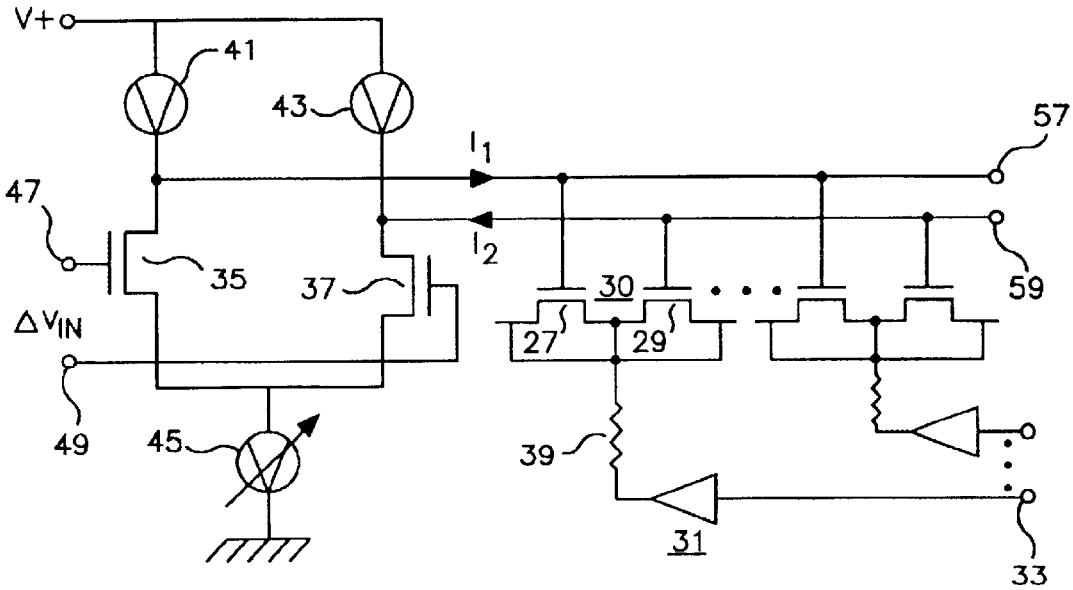
FIG. 2 is a circuit diagram of one embodiment of the present invention.

In accordance with one embodiment of the present invention, one or more differential pairs of capacitive elements are formed for selective connection into the circuit in response to an applied control signal. Specifically, as shown in FIG. 2, each capacitive element is formed as a pair of gain elements 27, 29 such as insulated-gate field-effect transistors with source and drain connected in common as one capacitive electrode and with the gate forming another capacitive electrode. The source-drain connections are connected in common to a control switch 31 that may also include a gain element responsive to an applied control signal for switching in or out the differential pair of capacitive components 27, 29. Specifically, at low-level applied control signal appearing on control input 33 (representative of the ON condition for NMOS type transistors 27, 29) the source-drain connections form conductive channels in the region of the respective gates in known manner to form capacitive components differentially connected across the outputs of the gain stages 35, 37. Thus, for each capacitive component of capacitance C, the differential connection of such components yields C/2 capacitance, without the equivalent resistance 39 of a control switch (in the biasing circuit) affecting the capacitance in the circuit thus configured. At high-level applied control signal appearing on control input 33 (representative of the OFF condition for NMOS type transistors 27, 29), wide depletion regions form adjacent the sources-drains, or essentially no channels form in the vicinities of the gates to contribute only a small fraction of the original capacitance introduced into the circuit. One or more banks of differentially connected capacitive components, each controlled by such bias-adjusting switching circuitry, may be provided to facilitate adjustment or control of the frequency response characteristics of the circuit thus configured.

Figure 3:
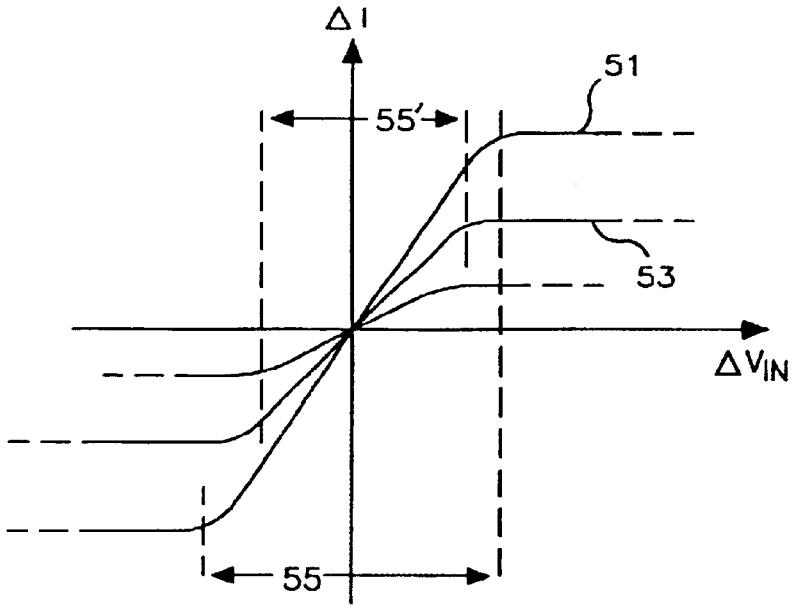
FIG. 3 is a graph illustrating the operating characteristics of a transconductance amplifier.

Referring now to FIG. 3, there is shown a graph of the transfer function of the differential amplifier of FIG. 2 that includes gain elements 35, 37 and current sources 41, 43, 45 connected as shown. Specifically, as the differential of the control voltages 47, 49 applied to the control electrodes increases, the differential of drain currents $I_1$, $I_2$ ($\Delta I=I_1-I_2$) increases, as shown by the curve 51. In the semiconductor amplifier circuit of FIG. 2, the sum of the drain currents 41, 43 substantially equals the combined current 45, and reducing these current levels typically alters the transfer function of the semiconductor amplifier, as shown by curve 53. The range of control voltages 55 over which the transfer function remains substantially linear diminishes with reduced current levels, as illustrated with reference to curve 53. Thus, at low levels of the combined source currents through current source 45, the substantially linear range of the transfer function on applied control voltages is narrow, and widens 55 with increased current levels. However, for a given level of the combined currents through source 45, significant increases in applied signal voltages appearing at inputs 47, 49 introduces significant non-linearity in the transfer function for operation at applied signal levels beyond the substantially linear range 55.

Figure 4:
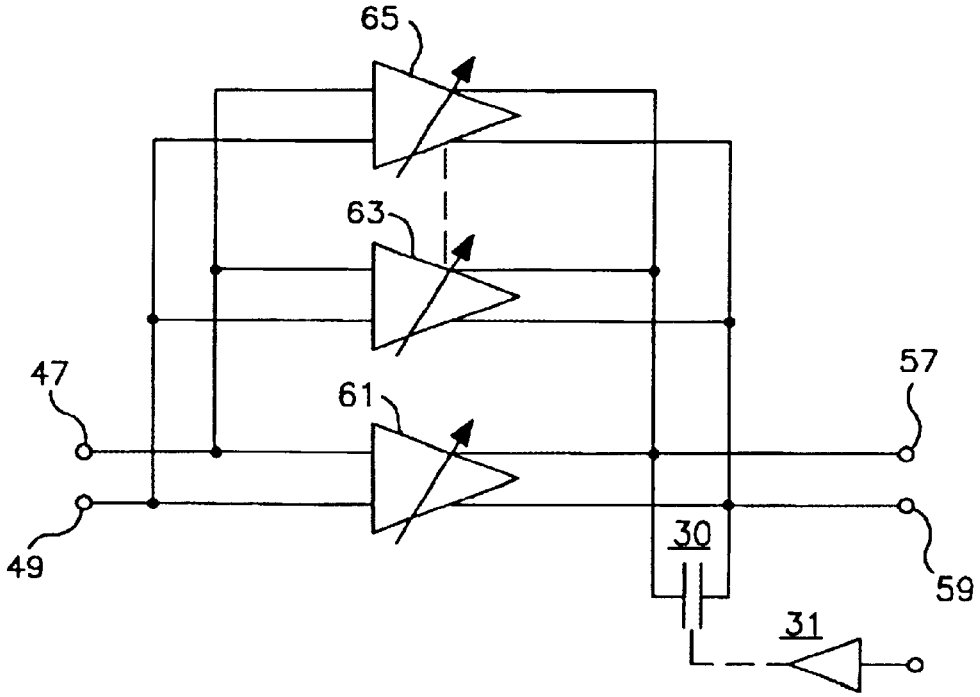
FIG. 4 is a circuit diagram of another embodiment of the present invention for providing wide dynamic control of operating frequency characteristics of the composite circuitry.

In accordance with another embodiment of the present invention, a plurality of amplifiers similar to the amplifier of FIG. 2 are assembled in parallel, as illustrated in FIG. 4, between the differential inputs 47, 49 and the differential outputs 57, 59. Each of the amplifiers may be selectively controlled, for example, via a controllable current source 45 that conducts the currents from the commonly connected sources in each amplifier. In this way, each of the amplifiers 61, 63, 65 may be selectively disabled or enabled to selectively expand the linear range 55, 55' of the combined transfer function. In addition, with one or more pairs of differentially connected capacitive components 27, 29 connected across the outputs 57, 59, the range of frequencies over with the integrated circuit may be operated can be greatly increased, for example, to over 6:1 for operations at about 40 MHz to about 270 MHz. Additionally, for selected values of capacitance C switched into the circuit in the manner previously described, control of one or more of the current sources in the amplifiers 61, 63, 65 may thus be externally controlled to maintain the transconductance ($g_m$) to capacitance (C) ratio ($g_m$/C) substantially constant over a population of integrated circuits thus configured, and for operation of a particular integrated circuit with selected frequency response characteristics. Of course, various known semiconductor technologies such as bi-polar or NMOS or CMOS processes may be used to form integrated circuits including amplifiers and capacitive components, as described above.

Therefore, one design of integrated circuit according to the present invention facilitates formation of $g_m$/C integrators operable over a wide range of frequencies, with dynamic responses conveniently controllable by signals that may be internal or external to the integrated circuit.

What is claimed is:

1. Integrator apparatus comprising:

an amplifier including a pair of outputs and being responsive to differential input signals for producing differential output signals on the pair of outputs; and a pair of capacitive components connected to the pair of outputs and to a common source of first control signal, the capacitive components including insulated-gate, field-effect transistors having gates connected to respective ones of the pair of outputs and having sources and drains connected in common to receive said first control signal for altering the capacitance of [each] *said* pair of capacitive [component] *components* in response to the first control signal applied to the sources and drains thereof.

2. Integrator apparatus according to claim 1 comprising a plurality of pairs of capacitive components, each including insulated-gate, field-effect transistors having gates connected to respective ones on the pair of outputs and having sources and drains connected in common to receive the first control signal therefor for altering the capacitance of the capacitive components in response to the first control signal applied to the sources and drains of each of the plurality of pairs of capacitive components.

3. Integrator apparatus according to claim 2 wherein the amplifier includes a plurality of differential amplifiers, each having a pair of outputs coupled in common to the plurality of pairs of capacitive components, and each having a pair of inputs connected in common to receive applied differential signals, at least one of the plurality of differential amplifiers also having a transfer function from inputs thereof to outputs thereof that is controllable in response to a second control signal applied thereto for altering the combined transfer function of the plurality of differential amplifiers from the inputs thereof connected in common to the differential outputs thereof coupled in common in response to applied second control signal.

4. Integrator apparatus according to claim 1 wherein said amplifier includes a pair of field-effect transistors, each having a drain electrode connected to respective ones of said pair of outputs, and having source electrodes connected in common, with the source and drain electrodes of each transistor forming a conduction channel thereof, and transistors having gate electrodes connected to receive the differential input signals applied thereto to alter the conduction channel thereof; and a current source connected to the drain electrode of each transistor, and another current source connected to the common connection of the source electrodes for conducting the sum of currents in the conduction channels of the pair of transistors.

5. Integrator apparatus according to claim 4, wherein said another current source is adjustable to alter the transfer function of the amplifier from the gate electrodes to the pair of outputs thereof.

6. Integrator apparatus according to claim 3 wherein the second control signal is adjusted to maintain substantially constant the ratio of the transconductance of the amplifier to the capacitance provide by the capacitive components in response to first control signal applied thereto.

*7. Integrator apparatus comprising:*

*an amplifier including a pair of outputs and being responsive to differential input signals for producing differential output signals on the pair of outputs; and*

*a capacitive element connected to the pair of outputs and to a common source of a control signal, the capacitive element including two field-effect transistors having gates connected to respective ones of the pair of outputs and having sources and drains connected in common to receive said control signal for altering the capacitance of said capacitive element in response to the control signal applied to the sources and drains thereof.*

*8. Integrator apparatus according to claim 7 further comprising a plurality of capacitive elements, each element including two insulated-gate, field-effect transistors having gates connected to respective ones on the pair of outputs and having sources and drains connected in common to receive a respective control signal, the capacitance of each capacitive elements being altered in response to the respective control signal applied to the sources and drains thereof.*

*9. Integrator apparatus according to claim 8 wherein the amplifier includes a plurality of differential amplifiers, each having a pair of outputs coupled in common to the plurality of pairs of capacitive elements, and each having a pair of inputs connected in common to receive applied differential signals, at least one of the plurality of differential amplifiers also having a transfer function from inputs thereof to outputs thereof that is controllable in response to a second control signal applied thereto for altering the combined transfer function of the plurality of differential amplifiers from the inputs thereof connected in common to the differential outputs thereof coupled in common in response to applied second control signal.*

*10. Integrator apparatus according to claim 9 wherein the second control signal is adjusted to maintain substantially constant the ratio of the transconductance of the amplifier to the capacitance provided by the capacitive elements in response to first control signal applied thereto.*

*11. Integrator apparatus according to claim 7 wherein said amplifier includes:*

*a pair of field-effect transistors, each having a drain electrode connected to respective ones of said pair of outputs, and having source electrodes connected in common, with the source and drain electrodes of each transistor forming a conduction channel thereof, and transistors having gate electrodes connected to receive the differential input signals applied thereto to alter the conduction channel thereof; and*

*a current source connected to the drain electrode of each transistor, and another current source connected to the common connection of the source electrodes for conducting the sum of currents in the conduction channels of the pair of transistors.*

*12. Integrator apparatus according to claim 11 wherein said another current source is adjustable to alter the transfer function of the amplifier from the gate electrodes to the pair of outputs thereof.*

*13. Integrator apparatus comprising:*

*a plurality of differential amplifiers, each having:*

*a pair of inputs connected in common to receive an applied differential signal*

*a pair of outputs connected in common to output a differential amplified signal, and*

*a transfer function from inputs thereof to outputs thereof that is controllable in response to a control signal applied thereto for altering the combined transfer function of the plurality of differential amplifiers from the inputs thereof to the outputs thereof,*

*wherein the plurality of differential amplifiers are of the same conductivity type.*

*14. Integrator apparatus according to claim 13, wherein each of the plurality of differential amplifiers further comprises a controllable current source to control the transfer function in response to the control signal applied thereto.*

*15. Integrator apparatus comprising:*

*a plurality of differential amplifiers, each having:*

*a pair of inputs connected in common to receive an applied differential signal,*

*a pair of outputs connected in common to output a differential amplified signal, and*

*a transfer function from inputs thereof to outputs thereof that is controllable in response to a control signal applied thereto for altering the combined transfer function of the plurality of differential amplifiers from the inputs thereof to the outputs thereof,*

*wherein each of the plurality of differential amplifiers further comprises a controllable current source to control the transfer function in response to the control signal applied thereto, and*

*wherein each said controllable current source, in response to the control signal applied thereto selectively enables or disables a corresponding one of said plurality of differential amplifiers.*

*16. Integrator apparatus according to claim 13, wherein each of the plurality of differential amplifiers further comprises first and second current sources coupled respectively to drains of said differential amplifiers.*

*17. Integrator apparatus according to claim 13, wherein said apparatus is embodied in a MOS device.*

*18. Integrator apparatus comprising:*

*a plurality of differential amplifiers, each having:*

*a pair of inputs connected in common to receive an applied differential signal,*

*a pair of outputs connected in common to output a differential amplified signal, and*

*a transfer function from inputs thereof to outputs thereof that is controllable in response to a control signal applied thereto for altering the combined transfer function of the plurality of differential amplifiers from the inputs thereof to the outputs thereof,*

*a plurality of capacitive elements each with two transistors whose gates are respectively coupled to said respective pair of outputs, said two transistors having sources and drains coupled in common to receive another control signal which alters the capacitance of said capacitive element.*

*19. Integrator apparatus according to claim 18, further comprising a plurality of said capacitive elements, and wherein said control signal and said another control signal cause the integrator apparatus to be operated in a frequency range of from about 40 MHz to about 270 MHz.*

*20. Integrator apparatus according to claim 18, wherein said control signal and said another control signal cause the integrator apparatus to maintain a transductance to capacitance ratio substantially constant.*

*21. An amplifier comprising:*

*a plurality of differential amplifiers, each having:*

*a pair of gain elements having (i) a pair of differential input terminals, (ii) a pair of differential output terminals, and (iii) a pair of common terminals; and*

*a controllable current source in communication with said pair of common terminals;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*wherein the plurality of differential amplifiers are of the same conductivity type.*

*22. An amplifier comprising:*

*a plurality of differential amplifiers, each having:*

*a pair of gain elements having (i) a pair of differential input terminals (ii) a pair of differential output terminals and (iii) a pair of common terminals; and*

*a controllable current source in communication with said pair of common terminals;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*wherein each said controllable current source selectively enables or disables a corresponding one of said plurality of differential amplifiers.*

*23. An amplifier comprising:*

*a plurality of differential amplifiers each having:*

*a pair of gain elements having (i) a pair of differential input terminals (ii) a pair of differential output terminals, and (iii) a pair of common terminals; and*

*a controllable current source in communication with said pair of common terminals;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*wherein each of said plurality of differential amplifiers further comprises:*

*a pair of transistors in communication with said pair of differential output terminals, said pair of transistors comprising a control terminal and being arranged as a capacitance*

*wherein said control terminal is arranged and constructed for receiving a control signal for adjusting the capacitance.*

*24. An amplifier according to claim 23, further comprising a plurality of said pair of transistors, each having gates coupled in parallel, and each having sources and drains coupled together to receive said control signal.*

*25. An amplifier according to claim 21, wherein said amplifier comprises a CMOS device.*

*26. An amplifier according to claim 21 wherein each of said plurality of differential amplifiers includes first and second current sources respectively coupled to said differential output terminals.*

*27. An amplifier comprising:*

*a plurality of differential amplifiers, each having:*

*a pair of differential input terminals,*

*a pair of differential output terminals and*

*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein the plurality of differential amplifiers are of the same conductivity type*

*wherein each of said plurality of differential amplifiers has a response characteristic defined by a corresponding transfer function from said pair of input terminals to said pair of output terminals; and*

*wherein each of said controllable current source controls the corresponding transfer function of a respective one of said plurality of differential amplifiers.*

*28. An amplifier comprising:*

*a plurality of differential amplifiers, each having:*

*a pair of differential input terminals*

*a pair of differential output terminals and*

*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said the plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*wherein each said controllable current source selectively enables or disables a corresponding one of said plurality of differential amplifiers.*

*29. An amplifier comprising:*

*a plurality of differential amplifiers, each having:*

*a pair of differential input terminals,*

*a pair of differential output terminals and*

*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*wherein each of said plurality of differential amplifiers further comprises:*

*a pair of transistors in communication with said pair of differential output terminals, said pair of transistors comprising a control terminal and being arranged as a capacitance, wherein said control terminal is arranged and constructed for receiving a control signal for adjusting the capacitance.*

*30. An amplifier comprising:*

*a plurality of differential amplifiers, each having*

*a pair of differential input terminals,*

*a pair of differential output terminals and*

*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals other ones of said plurality of differential amplifiers;*

*wherein each of said plurality of differential amplifiers has a response characteristic defined by a corresponding transfer function from said pair of input terminals to said pair of output terminals;*

*wherein each of said controllable current source controls the corresponding transfer function of a respective one of said plurality of differential amplifiers; and*

*a plurality of said transistors each having gates coupled in parallel, and each having sources and drains coupled together to receive said control signal.*

*31. Integrator apparatus comprising:*

*an amplifier including a pair of outputs and being responsive to a differential input signal for producing differential output signals on the pair of outputs; and*

*a capacitance in communication with the pair of outputs and to a first control signal, the capacitance comprising plural transistors having gates connected to respective ones of the pair of and having sources and drains connected in common to receive said control signal for altering the capacitance in response to the first control signal applied to the sources and drains thereof.*

*32. Integrator apparatus according to claim 31, wherein said amplifier comprises a pair of semiconductor gain elements having drains coupled to said pair of outputs, sources coupled in common to receive a second control signal, and gates which receive the differential input signal.*

*33. Integrator apparatus according to claim 31, further comprising a plurality of said amplifiers having their outputs coupled in parallel, and their inputs coupled in parallel.*

*34. Integrator apparatus according to claim 31, further comprising a plurality of said capacitances having their outputs coupled in parallel.*

*35. Integrator apparatus according to claim 31, wherein said transistors comprise MOS transistors, and wherein the first control signal causes wide depletion regions to form adjacent said sources and drains to inhibit channels forming in the vicinities of the gates to reduce capacitance.*

*36. A semiconductor apparatus comprising:*

*a differential circuit including first and second outputs and being responsive to a differential input signal for producing differential output signals on the first and second outputs; and*

*a capacitance in communication with the first and second outputs and responsive to a single control signal, the capacitance comprising first and second transistors, a gate of the first transistor being in communication with the first output and a gate of the second transistor being in communication with the second output, a source and a drain of the first transistor being connected in common to receive the single control signal, a source and a drain of the second transistor being connected in common to receive the single control signal, the first control signal being applied to the sources and drains thereof for altering the capacitance.*

*37. A semiconductor apparatus according to claim 36, wherein said apparatus Comprises a MOS circuit.*

*38. A semiconductor apparatus according to claim 36, further comprising a plurality of differential circuits coupled in parallel, and a plurality of said first and second transistors having their gates coupled to outputs of said plurality of said differential circuits.*

*39. Integrator apparatus comprising:*

*a plurality of differential amplifiers, each having:*

*a pair of inputs connected in common to receive an applied differential signal*

*a pair of outputs connected in common to output a differential amplified signal, and*

*a transfer function from inputs thereof to outputs thereof that is controllable in response to a control signal applied thereto for altering the combined transfer function of the plurality of differential amplifiers from the inputs thereof to the outputs thereof,*

*wherein each of said plurality of differential amplifiers has the same conductivity type as all of the other differential amplifiers of said plurality of differential amplifiers.*

*40. Integrator apparatus according to claim 39 wherein each of the plurality of differential amplifiers further comprises a controllable current source to control the transfer function in response to the control signal applied thereto.*

*41. Integrator apparatus comprising:*

*a plurality of differential amplifiers, each having a pair of inputs connected in common to receive an applied differential signal, a pair of outputs connected in common to output a differential amplified signal, and a transfer function from inputs thereof to outputs thereof that is controllable in response to a control signal applied thereto for altering the combined transfer function of the plurality of differential amplifiers from the inputs thereof to the outputs thereof,*

*wherein each of the plurality of differential amplifiers further comprises a controllable current source,*

*wherein each said controllable current source in response to the control signal applied thereto, selectively enables or disables a corresponding one of said plurality of differential amplifiers.*

*42. An amplifier comprising:*

*a plurality of differential amplifiers each having:*

*a pair of gain elements having (i) a pair of differential input terminals, (ii) a pair of differential output terminals, and (iii) a pair of common terminals; and*

*a controllable current source in communication with said pair of common terminals;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers is the same conductivity type as all of the other differential amplifiers of said plurality of differential amplifiers;*

*wherein each of said plurality of differential amplifiers has a response characteristic defined by a corresponding transfer function from said pair of input terminals to said pair of output terminals; and*

*wherein each of said controllable current source controls the corresponding transfer function of a respective one of said plurality of differential amplifiers.*

*43. An amplifier according to claim 42 wherein each said controllable current source selectively enables or disables a corresponding one of said plurality of differential amplifiers.*

*44. An amplifier comprising:*

*a plurality of differential amplifiers, each having:*

*a pair of gain elements having (i) a pair of differential input terminals, (ii) a pair of differential output terminals, and (iii) a pair of common terminals; and*

*a controllable current source in communication with said pair of common terminals;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals; and*

*wherein each of said controllable current source selectively enables or disables a corresponding one of said plurality of differential amplifiers.*

*45. An amplifier comprising:*

*a plurality of differential amplifiers, each having:*
*a pair of differential input terminals,*
*a pair of differential output terminals, and*
*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers is the same conductivity type as all of the other differential amplifiers of said plurality of differential amplifiers,*

*wherein each of said plurality of differential amplifiers has a response characteristic defined by a corresponding transfer function from said pair of input terminals to said pair of output terminals; and*

*wherein each of said controllable current source controls the corresponding transfer function of a respective one of said plurality of differential amplifiers.*

*46. An amplifier comprising:*

*a plurality of differential amplifiers, each having*
*a pair of differential input terminals,*
*a pair of differential output terminals and*
*a controllable current source;*

*wherein each of said pair of differential input terminals is arranged in parallel with the differential input terminals of other ones of said plurality of differential amplifiers;*

*wherein each of said pair of differential output terminals is arranged in parallel with the differential output terminals of other ones of said plurality of differential amplifiers;*

*wherein each of said plurality of differential amplifiers has a response characteristic defined by a corresponding transfer function from said pair of input terminals to said pair of output terminals; and*

*wherein each of said controllable current source selectively enables or disables a corresponding one of said plurality of differential amplifiers.*

* * * * *

UNITED STATES PATENT AND TRADEMARK OFFICE

CERTIFICATE OF CORRECTION

PATENT NO. : RE 37,739 E
DATED : June 11, 2002
INVENTOR(S) : Sutardja et al.

It is certified that error appears in the above-identified patent and that said Letters Patent is hereby corrected as shown below:

Title page,
Insert -- Notice: More than one reissue application has been filed for the reissue of patent 5,805,006. The reissue applications are 09/609,007 filed June 22, 2002, now US Patent RE37,739 and 09/950086 filed September 12, 2001. --

Signed and Sealed this

Twentieth Day of May, 2003

JAMES E. ROGAN
*Director of the United States Patent and Trademark Office*

UNITED STATES PATENT AND TRADEMARK OFFICE

CERTIFICATE OF CORRECTION

PATENT NO. : RE37,739 E
APPLICATION NO. : 09/609007
DATED : June 11, 2002
INVENTOR(S) : Sehat Sutardja et al.

It is certified that error appears in the above-identified patent and that said Letters Patent is hereby corrected as shown below:

Column 1, Lines 7-13 Insert after "the additions made by reissue" and before "FIELD OF THE INVENTION" --Notice: More than one reissue application has been filed for the reissue of U.S. Pat. No. 5,805,006. The reissue applications are application Ser. Nos. 10/614,084, a continuation of 09/650,086 (now U.S. Pat. No. RE38,455), a continuation of 09/609,007 (the present application), which is the reissue application of U.S. Pat. No. 5,805,006.--

Signed and Sealed this
Twenty-ninth Day of March, 2011

David J. Kappos

David J. Kappos
*Director of the United States Patent and Trademark Office*